(12) United States Patent
Chiu et al.

(10) Patent No.: US 8,173,503 B2
(45) Date of Patent: May 8, 2012

(54) FABRICATION OF SOURCE/DRAIN EXTENSIONS WITH ULTRA-SHALLOW JUNCTIONS

(75) Inventors: Yihang Chiu, Toufen (TW); Chu-Yun Fu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/617,955

(22) Filed: Nov. 13, 2009

(65) Prior Publication Data

US 2010/0216288 A1   Aug. 26, 2010

Related U.S. Application Data

(60) Provisional application No. 61/154,667, filed on Feb. 23, 2009.

(51) Int. Cl.
*H01L 21/8238* (2006.01)
*H01L 21/336* (2006.01)

(52) U.S. Cl. ......... 438/231; 257/E21.424; 257/E21.632; 438/305

(58) Field of Classification Search .................... 438/231
See application file for complete search history.

(56) References Cited

U.S. PATENT DOCUMENTS

| | | | |
|---|---|---|---|
| 4,889,819 A * | 12/1989 | Davari et al. .................. | 438/527 |
| 6,225,176 B1 * | 5/2001 | Yu ................................ | 438/305 |
| 6,331,458 B1 * | 12/2001 | Anjum et al. .................. | 438/197 |
| 6,682,980 B2 * | 1/2004 | Chidambaram et al. ....... | 438/302 |
| 6,852,603 B2 * | 2/2005 | Chakravarthi et al. ........ | 438/369 |
| 7,410,876 B1 * | 8/2008 | Min et al. ...................... | 438/301 |
| 2006/0284249 A1 * | 12/2006 | Chen et al. ..................... | 257/344 |
| 2007/0010073 A1 * | 1/2007 | Chen et al. ..................... | 438/486 |
| 2008/0061385 A1 * | 3/2008 | Joo ................................ | 257/412 |
| 2008/0070370 A1 * | 3/2008 | Wu et al. ........................ | 438/301 |
| 2008/0206973 A1 * | 8/2008 | Johnson et al. ............... | 438/585 |
| 2009/0079008 A1 * | 3/2009 | Nandakumar et al. ........ | 257/377 |

OTHER PUBLICATIONS

Li, H.-J., et al., "Boron Retarded Diffusion in the Presence of Indium or Germanium," IEEE, Nov. 2002, pp. 646-648, vol. 23, No. 11.

* cited by examiner

*Primary Examiner* — N Drew Richards
*Assistant Examiner* — Robert Carpenter
(74) *Attorney, Agent, or Firm* — Slater & Matsil, L.L.P.

(57) ABSTRACT

A method of forming an integrated circuit device includes providing a semiconductor substrate; forming a gate structure on the semiconductor substrate; and performing a pre-amorphized implantation (PAI) by implanting a first element selected from a group consisting essentially of indium and antimony to a top portion of the semiconductor substrate adjacent to the gate structure. The method further includes, after the step of performing the PAI, implanting a second element different from the first element into the top portion of the semiconductor substrate. The second element includes a p-type element when the first element includes indium, and includes an n-type element when the first element includes antimony.

7 Claims, 6 Drawing Sheets

FABRICATION OF SOURCE/DRAIN EXTENSIONS WITH ULTRA-SHALLOW JUNCTIONS

This application claims the benefit of U.S. Provisional Application No. 61/154,667 filed on Feb. 23, 2009, entitled "Fabrication of Source/Drain Extensions with Ultra-Shallow Junctions," which application is hereby incorporated herein by reference.

TECHNICAL FIELD

This invention relates generally to semiconductor devices, and more particularly to metal-oxide-semiconductor (MOS) devices, and even more particularly to MOS devices having ultra-shallow junctions and methods for forming the same.

BACKGROUND

With the increasing down-scaling of integrated circuits, there exist increasingly demanding requirements for reducing the sheet resistance of source and drain regions of metal-oxide-semiconductor (MOS) devices, and particularly the sheet resistance of source and drain extension regions. Reduced sheet resistances in the source and drain extension regions may help increase carrier mobility, hence resulting in increased drive currents.

To reduce the sheet resistance of source and drain extension regions, the junction depth of the source and drain extension regions needs to be reduced. In addition, the activation rate of the source and drain extension regions needs to be increased. These can be achieved by performing pre-amorphized implantation (PAI), in which a portion of a silicon substrate is amorphized before the source and drain regions are formed. The PAI has two functions. First, vacancies are created in the semiconductor substrate, so that the subsequently implanted p-type or n-type impurities may occupy the vacancies more easily. Accordingly, the activation rate may be improved. Second, in the amorphized substrate, atoms are arranged randomly, and hence the subsequently implanted p-type or n-type impurities cannot channel through the spaces between the periodically located atoms to reach a great depth. The PAI, however, also incurs problems. For example, after the activation, residue defects may still exist and will cause an increase in leakage currents. Such leakage currents prevent further improvement of device performance.

SUMMARY OF THE INVENTION

In accordance with one aspect of the present invention, a method of forming an integrated circuit device includes providing a semiconductor substrate; forming a gate structure on the semiconductor substrate; and performing a pre-amorphized implantation (PAI) by implanting a first element selected from a group consisting essentially of indium and antimony to a top portion of the semiconductor substrate adjacent to the gate structure. The method further includes, after the step of performing the PAI, implanting a second element different from the first element into the top portion of the semiconductor substrate. The second element includes a p-type element when the first element includes indium, and includes an n-type element when the first element includes antimony.

In accordance with another aspect of the present invention, a method of forming an integrated circuit device includes providing a semiconductor substrate; forming a gate structure on the semiconductor substrate; performing a PAI by implanting a first element selected from a group consisting essentially of indium and antimony to a top portion of the semiconductor substrate adjacent to the gate structure; and, after the step of performing the PAI, implanting a second element different from the first element into the top portion of the semiconductor substrate. A second depth of the second element is substantially no greater than a first depth of the first element.

In accordance with yet another aspect of the present invention, a method of forming an integrated circuit device includes providing a semiconductor substrate having an NMOS region and a PMOS region; forming a first gate structure over the NMOS region of the semiconductor substrate; forming a second gate structure over the PMOS region of the semiconductor substrate; performing a first PAI by implanting a first element into the NMOS region of the semiconductor substrate; and performing a second PAI by implanting a second element different from the first element into the PMOS region of the semiconductor substrate.

The advantageous features of the present invention include reduced sheet resistance and reduced junction depth in source and drain extension regions, and reduced leakage currents compared to the commonly used Ge PAI method.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Figure 1:
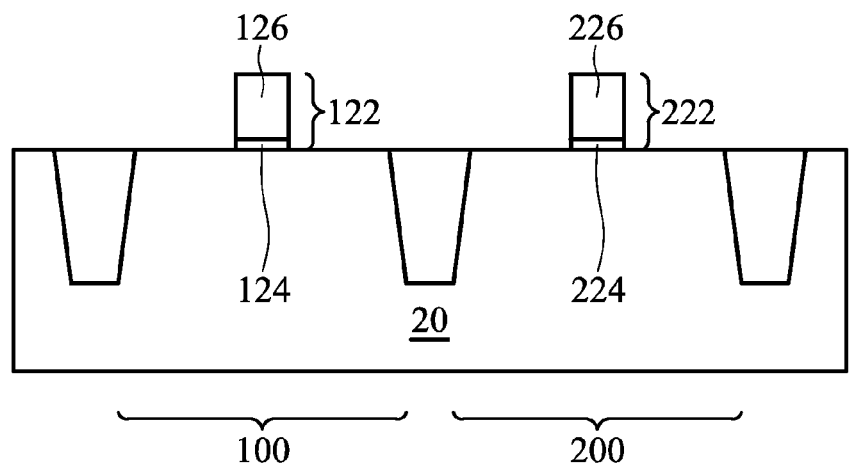
FIGS. 1 through 6 are cross-sectional views of intermediate stages in the manufacturing of a metal-oxide-semiconductor (MOS) device.

Conventionally, pre-amorphized implantation (PAI) was performed by implanting germanium ions into silicon substrates. However, it has been found that the metal-oxide-semiconductor (MOS) device formed using germanium PAI can no longer provide low sheet resistances, small junction depths, and low leakage currents that satisfy the demanding requirements of 32 nm and 22 nm technologies. A novel method for forming MOS devices and performing the PAI is thus provided. The intermediate stages of manufacturing an embodiment of the present invention are illustrated. The variations of the embodiments are then discussed. Through- FIG. 1 illustrates substrate 20, and the formation of gate stacks 122 and 222 on substrate 20. Substrate 20 may include a portion in NMOS region 100 and a portion in PMOS region 200, and may be formed of commonly known semiconductor materials such as silicon, SiGe, strained silicon on SiGe, silicon on insulator (SOI), silicon germanium on insulator (SGOI), germanium on insulator (GOI), and the like. Gate stack 122 is formed in NMOS region 100 and includes gate dielectric 124 and gate electrode 126. Gate stack 222 is formed in PMOS region 200 and includes gate dielectric 224 and gate electrode 226. Gate dielectrics 124 and 224 may be formed of silicon oxide, silicon nitride, or high-K dielectric materials. Gate electrodes 126 and 226 may be formed of polysilicon, metals, metal silicides, metal nitrides, or the like.

Figure 2A:
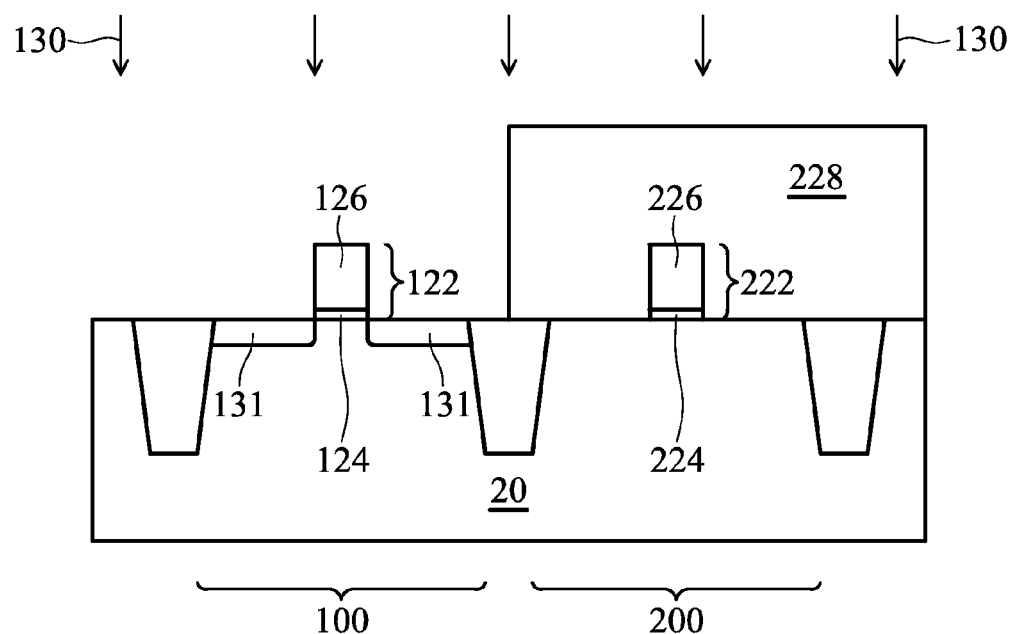

Referring to FIG. 2A, PMOS region 200 is covered by a mask, for example, photo resist 228, while NMOS region 100 is exposed. A pre-amorphized implantation (PAI) is performed, as symbolized by arrows 130. The PAI has the function of reducing the dopant channeling effect and enhancing dopant activation. In an embodiment, antimony ions are implanted in the PAI of NMOS region 100. At least a top portion of the (polysilicon) gate electrode 126 and exposed portions of crystalline substrate 20 are turned into an amorphous state as a result of the PAI, hence forming amorphous regions 131 (referred to as PAI regions 131 hereinafter). It is noted that the dosage of antimony needs to be great enough to amorphize substrate 20. On the other hand, the dosage of antimony should not impact the junction depth of a subsequently implanted n-type impurity, for example, phosphorous. In an exemplary embodiment, the dosage of the antimony PAI may be less than about $3\times10^{13}/cm^2$, and also may be between about $3\times10^{13}/cm^2$ and about $3\times10^{12}/cm^2$. After the antimony PAI, photo resist 228 is removed.

Figure 2B:
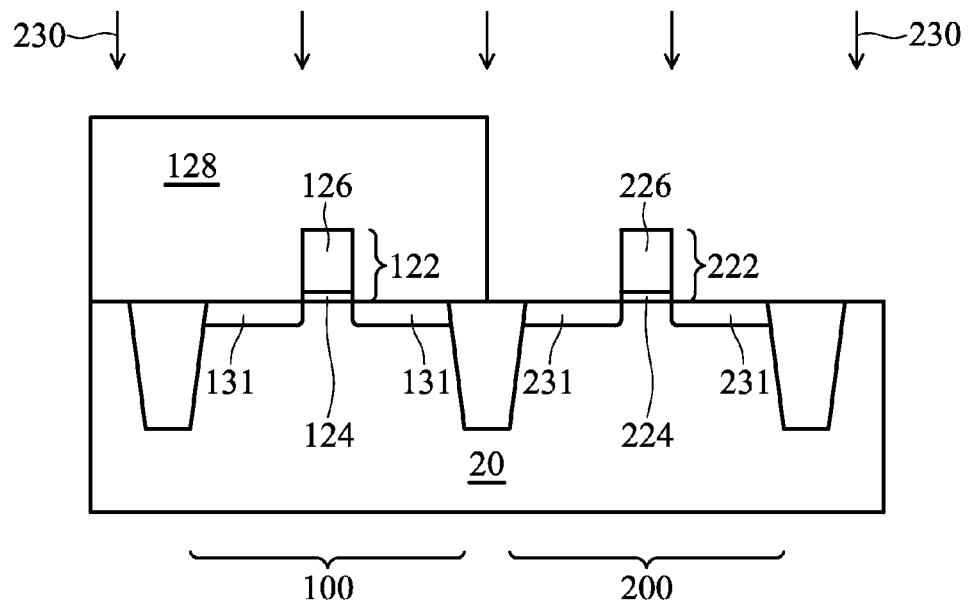

Referring to FIG. 2B, NMOS region 100 is covered by a mask, for example, photo resist 128, while PMOS region 200 is exposed. Another pre-amorphized implantation (PAI) is performed, as symbolized by arrows 230. In the embodiment, indium ions are implanted in the PAI of PMOS region 200. At least a top portion of (polysilicon) gate electrode 126 and exposed portions of crystalline substrate 20 are turned into an amorphous state as a result of the PAI, hence forming amorphous regions 231 (referred to as PAI regions 231 hereinafter). Again, the dosage of indium should be great enough to amorphize substrate 20 and low enough so that it will not impact the junction depth of a subsequently implanted p-type impurity, for example, boron. The optimum dosage may be found through experiments. In an exemplary embodiment, the dosage of the indium PAI may be less than about $3\times10^{13}/cm^2$, and also may be between about $3\times10^{13}/cm^2$ and about $3\times10^{12}/cm^2$. After the indium PAI, photo resist 128 is removed. The sequence of the steps shown in FIGS. 2A and 2B may be reversed.

Figure 3:
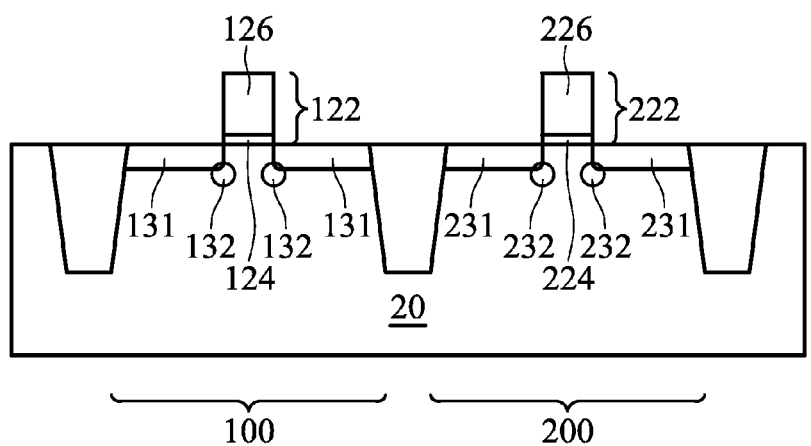

FIG. 3 illustrates the formation of pocket/halo regions 132 and 232, wherein pocket/halo regions 132 comprise p-type impurities, and pocket/halo regions 232 comprise n-type impurities. The implantation of pocket/halo regions 132 and 232 may include tilt implants. Further, photo resists (not shown) may be applied and patterned to assist the formation of pocket/halo regions 132 and 232.

Figure 4A:
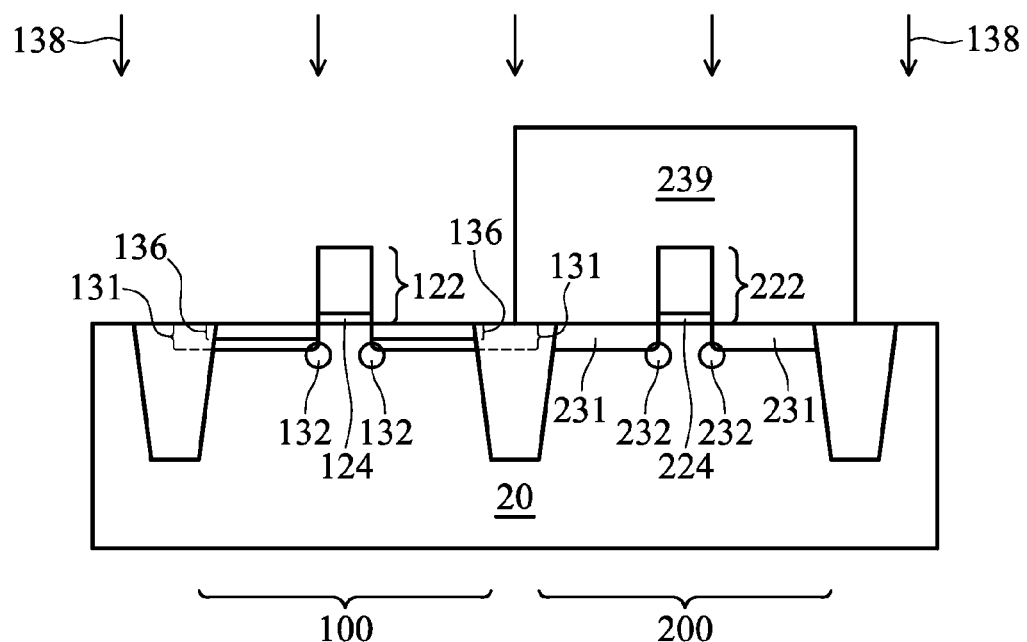

FIG. 4A illustrates the formation of source and drain extension (SDE) regions 136. SDE regions 136 are formed by implanting an n-type impurity, such as phosphorus or arsenic. Arrows 138 symbolize the implanting, which may be substantially vertical. At the time implantation 138 is performed, photo resist 239 covers PMOS region 200. The dosage for implantation 138 may be about $1E14/cm^3$ to about $1E15/cm^3$, which may be about one order (ten times) or greater than the dosage of antimony PAI. In an embodiment, the depth of SDE region 136 may be substantially equal to, or slightly less than (or example, with less than about 10 percent depth difference), the depth of PAI regions 131. SDE regions 136 and pocket/halo regions 132 can also be formed in reverse order.

Figure 4B:
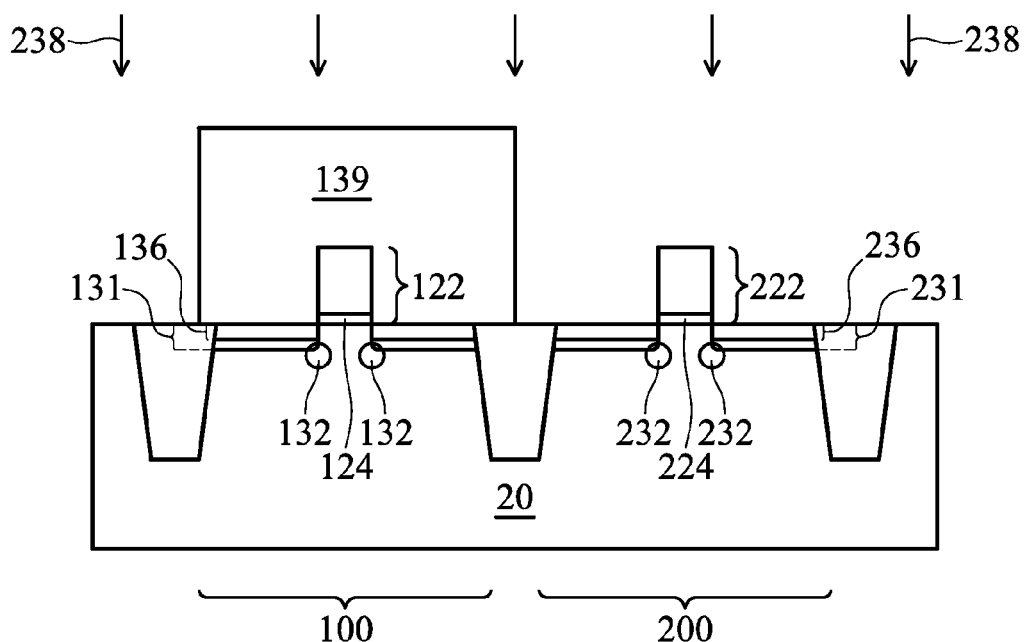

FIG. 4B illustrates the formation of source and drain extension (SDE) regions 236. SDE regions 236 are formed by implanting a p-type impurity, such as boron. Arrows 238 symbolize the implanting, which may be substantially vertical. At the time implantation 238 is performed, photo resist 139 covers NMOS region 100. In an embodiment, the depth of SDE regions 236 may be substantially equal to, or slightly less than, the depth of PAI regions 231. The dosage of implantation 238 may be about $1E14/cm^3$ to about $1E15/cm^3$, which may be about one order or greater than the dosage of the indium PAI. It is observed that the dosage differences between SDE regions 136 and PAI regions 131, and between SDE regions 236 and PAI regions 231, are beneficial for the resulting device. With the dosage differences, not only can optimum PAI dosage be achieved to ensure adequate amorphization without introducing excess defects, but high impurity concentration in SDE regions 236 can also be achieved. SDE regions 236 and pocket/halo regions 232 can also be formed in reverse order. An optional SDE dopant activation may also be performed.

Figure 5:
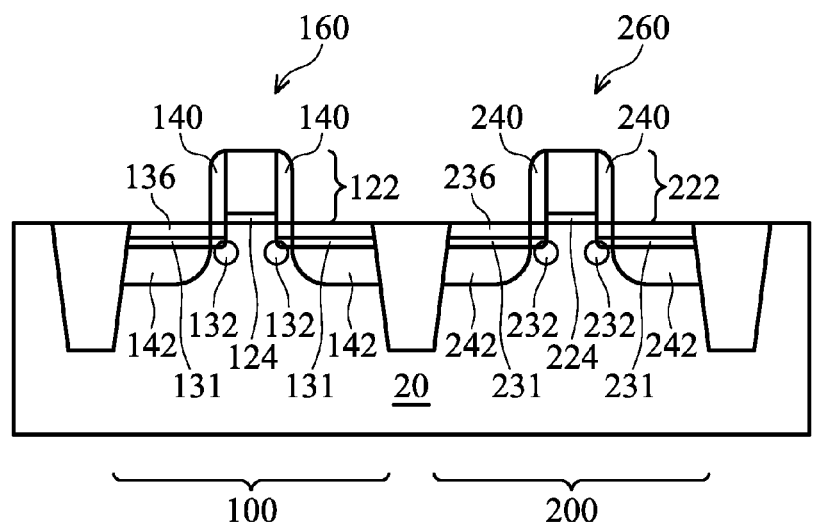

FIG. 5 illustrates the formation of spacers 140 and 240, heavily doped n-type source and drain (N+S/D) regions 142 and heavily doped p-type source and drain (P+S/D) regions 242. Spacers 140 are formed along the sidewalls of gate dielectric 124 and gate electrode 126, while spacers 240 are formed along the sidewalls of gate dielectric 224 and gate electrode 226. As is known in the art, spacers 140 and 240 may be formed by blanket depositing a dielectric layer over an entire region, and then performing an anisotropic etching to remove the dielectric layer from horizontal surfaces, thus leaving spacers 140 and 240.

Spacers 140 and 240 are used as masks for the formation of the N+S/D regions 142 and P+S/D regions 242, respectively. The implantation processes are known in the art, and hence are not repeated herein. The dosage of N+S/D regions 142 and P+S/D regions 242 may be between about $5\times10^{14}/cm^2$ and about $5\times10^{15}/cm^2$. The formation of P+S/D regions 242 may also include forming silicon germanium stressors.

The dopants introduced in the preceding processes are then activated. The activation annealing can be conducted using commonly used methods such as furnace annealing, rapid thermal annealing (RTA), laser annealing, flash annealing, and the like. During the activation annealing, the p-type dopants such as boron and the n-type dopants such as phosphorous will diffuse both vertically and laterally. However, with the antimony ions implanted to NMOS region 100 and indium ions implanted to PMOS region 200, the diffusion of boron and phosphorous is reduced. Less diffusion of boron and phosphorous results in higher concentrations in SDE regions 136 and 236 and S/D regions 142 and 242, and hence higher current drivability can be achieved for the resulting NMOS device 160 and PMOS device 260.

Figure 6:
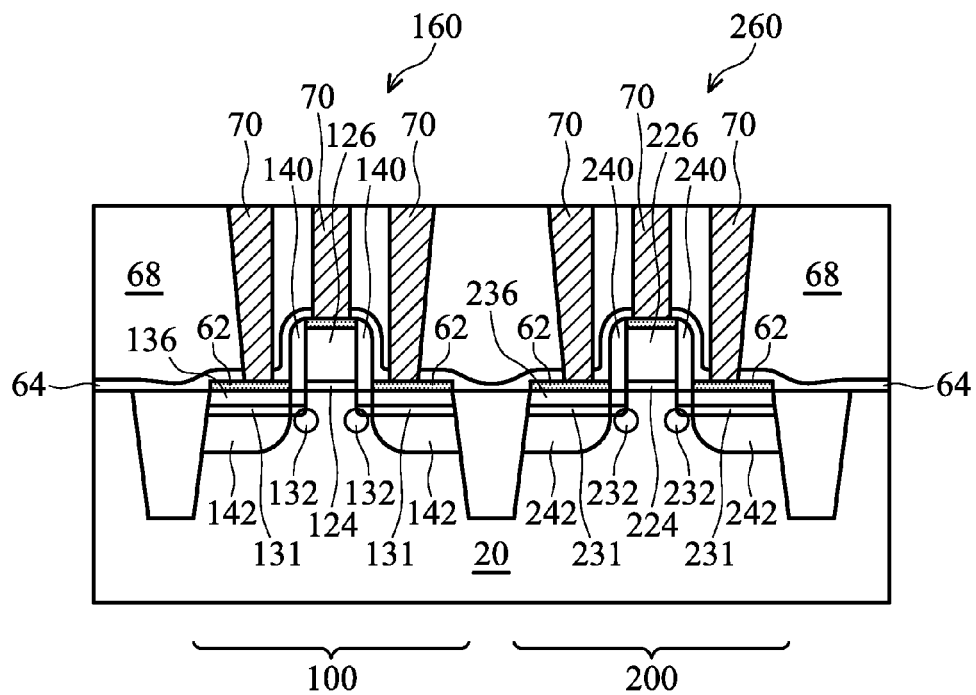

FIG. 6 illustrates a structure after the formation of silicides 62, contact etch stop layer (CESL) 64, inter-layer dielectric (ILD) 68, and contact plugs 70. To form silicides 62, a thin layer of metal (not shown), such as cobalt, nickel, erbium, molybdenum, platinum, or the like, is first formed over the MOS devices 160 and 260. The device is then annealed to form silicides 62 between the deposited metal and the underlying exposed silicon regions. The remaining metal layer is then removed. CESL 64 is preferably blanket deposited. This layer serves two purposes. First, it provides a stress to the device and enhances carrier mobility. Second, it protects underlying regions from being over-etched. Next, ILD 68 is deposited over the surface of CESL 64. Contact plugs 70 are then formed. The processes for forming such are well known in the art and therefore are not repeated herein.

Figure 7:
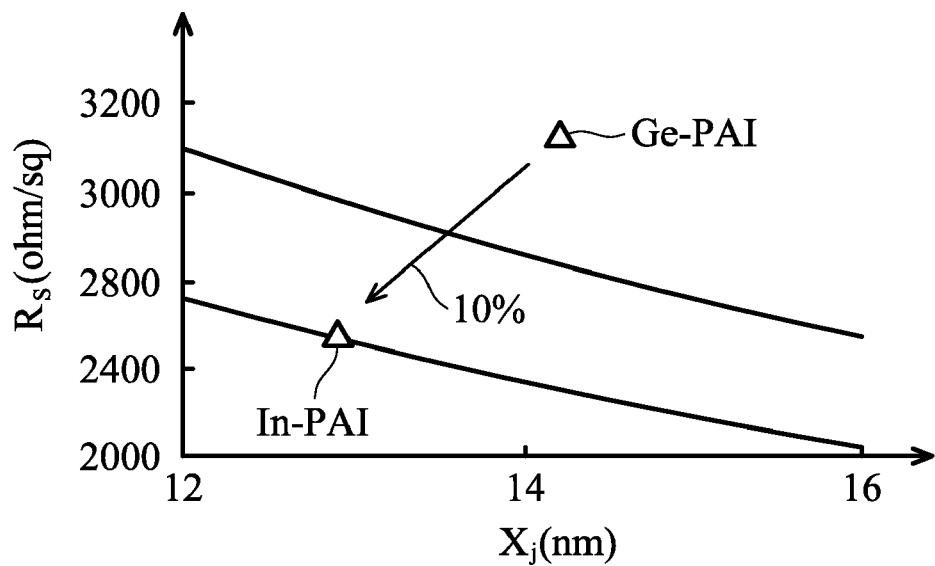
FIG. 7 illustrates sheet resistance as a function of junction depth, wherein the result of germanium pre-amorphized implantation (PAI) is compared to the result of indium PAI.
Figure 8:
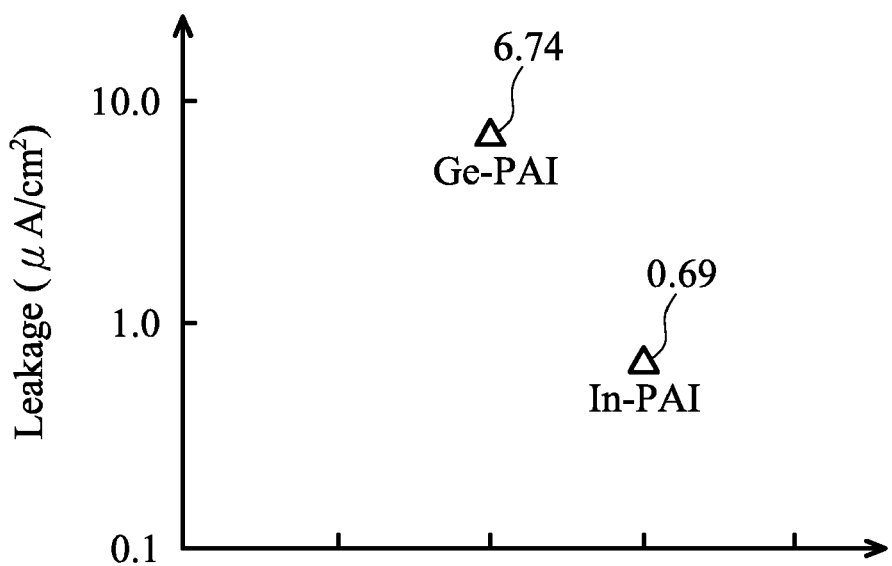
FIG. 8 illustrates leakage currents of junctions, wherein the result of germanium PAI is compared to the result of indium PAI.

The effect of the indium PAI to the performance of PMOS device 260 is shown in FIGS. 7 and 8. The data shown in FIGS. 7 and 8 are obtained by performing PAI and n-type implantation to blank sample wafers. FIG. 7 illustrates sheet resistance of the sample wafers as a function of junction depth Xj. It is noted that the product of sheet resistance and junction depth of the sample wafers amorphized using indium PAI is about 10 percent less than the product of sheet resistance and junction depth of the sample wafers amorphized using germanium PAI. Accordingly, PMOS devices formed using indium PAI will have higher hole mobility and higher driving currents. FIG. 8 illustrates that the junction leakage current of the sample wafers pre-amorphized using indium PAI is only about one-tenth the leakage current of sample wafers pre-amorphized using germanium PAI. Accordingly, the resulting PMOS devices formed using indium PAI also have low leakage currents.

Figure 9:
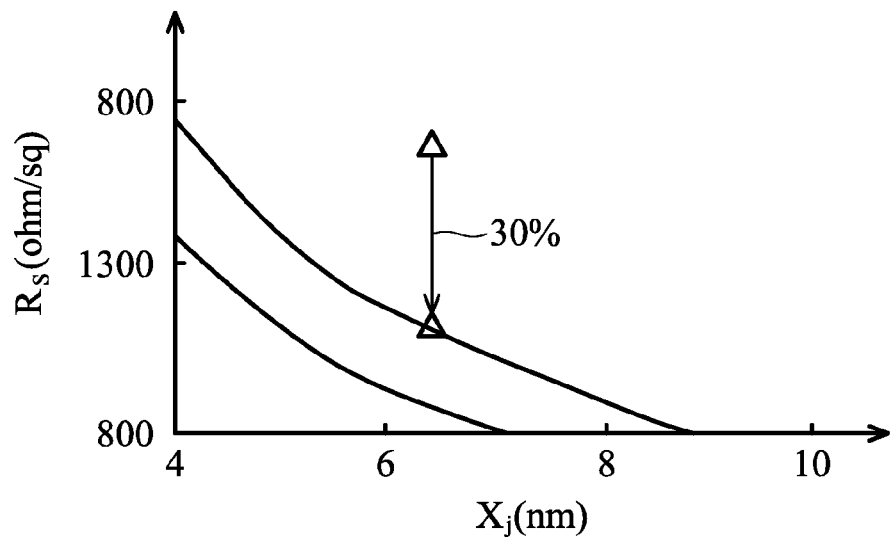
FIG. 9 illustrates sheet resistance as a function of junction depth, wherein the result of germanium PAI is compared to the result of antimony PAI.
Figure 10:
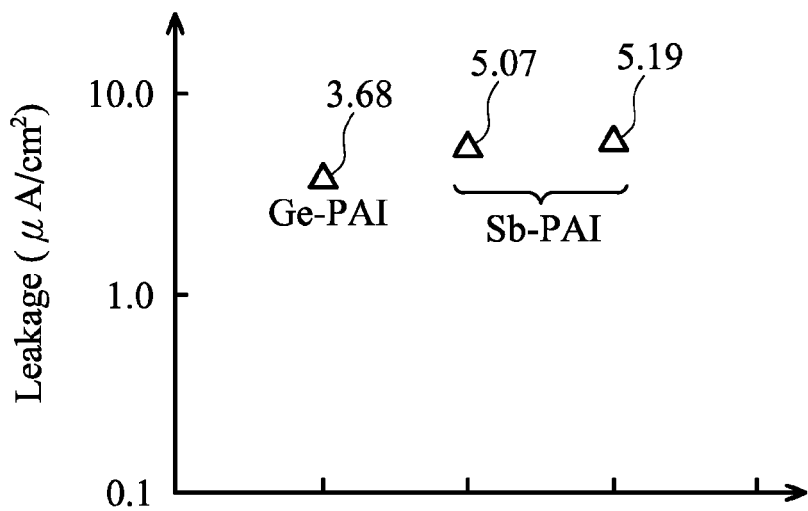
FIG. 10 illustrates leakage currents of junctions, wherein the result of germanium PAI is compared to the result of antimony PAI.

The effect of the antimony PAI to the performance of NMOS device 160 is shown in FIGS. 9 and 10. Again, the data shown in FIGS. 9 and 10 are obtained by performing PAI and p-type implantation to blank sample wafers. FIG. 9 illustrates sheet resistance as a function of junction depth Xj. It is noted that the product of sheet resistance and junction depth of the sample wafers amorphized using antimony PAI is about 30 percent less than the product of sheet resistance and junction depth of the sample wafers amorphized using germanium PAI. Accordingly, NMOS devices formed using the antimony PAI will have significantly higher activated carrier concentration and/or higher electron mobility and higher driving currents. FIG. 10 illustrates that the junction leakage currents of the sample wafers pre-amorphized using the antimony PAI are slightly worse than, but in a same order as, the leakage currents of the sample wafers pre-amorphized using the germanium PAI.

The desirable effect caused by indium PAI may be due to the great tetrahedral radius of indium, which is greater than the tetrahedral radius of germanium and the tetrahedral radius of boron. It is realized that indium, which has a greater tetrahedral radius than silicon, causes the distortion of the lattice of silicon and stress in the respective silicon substrate. Boron, which has a smaller tetrahedral radius than silicon, may ease the lattice distortion caused by indium. Accordingly, boron has the tendency to stay close to indium to compensate for the stress generated by indium. As a result, indium may retard the diffusion of boron, resulting in more abrupt SDE regions and an improved p-type junction profile, hence improved drive currents. Also, indium has the tendency to segregate from the substrate and to diffuse to the top surface of the substrate as a result of the activation annealing, and hence the residue indium in the respective substrate is further reduced, resulting in fewer defects after the activation annealing. For similar reasons, antimony can also reduce the diffusion of phosphorous, and hence results in improved drive currents for NMOS devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit device, the method comprising:
   providing a semiconductor substrate comprising an NMOS region and a PMOS region;
   forming a first gate structure over the NMOS region of the semiconductor substrate;
   forming a second gate structure over the PMOS region of the semiconductor substrate;
   performing a first pre-amorphized implantation (PAI) by implanting a first element into the NMOS region of the semiconductor substrate, wherein the first element comprises antimony;
   performing a second PAI by implanting a second element different from the first element into the PMOS region of the semiconductor substrate;
   performing a first implantation of a pocket/halo region into the NMOS region of the semiconductor substrate; and
   performing a second implantation of a pocket/halo region into the PMOS region of the semiconductor substrate, wherein the second element comprises indium.

2. The method of claim 1 further comprising:
   after the step of performing the first PAI, implanting phosphorus into the NMOS region of the semiconductor substrate to form a first source/drain extension (SDE) region; and
   after the step of performing the second PAI, implanting boron into the PMOS region of the semiconductor substrate to form a second source/drain extension (SDE) region.

3. The method of claim 2, wherein boron is implanted with a greater dosage than a dosage of indium, and wherein phosphorous is implanted with a greater dosage than a dosage of antimony.

4. The method of claim 1, wherein, during the step of performing the first PAI, a top portion of the NMOS region of the semiconductor substrate is converted from a crystalline state to an amorphous state, and wherein, during the step of performing the second PAI, a top portion of the PMOS region of the semiconductor substrate is converted from the crystalline state to the amorphous state.

5. The method of claim 1, wherein, during the step of performing the first PAI, the PMOS region of the semiconductor substrate is masked, and wherein, during the step of performing the second PAI, the NMOS region of the semiconductor substrate is masked.

6. The method of claim 1, wherein boron is implanted to a smaller depth than a depth of indium, and wherein phosphorous is implanted to a smaller depth than a depth of antimony.

7. The method of claim 1, wherein when the step of performing the first PAI is performed, the first element is simultaneously implanted into a gate electrode of the first gate structure, and wherein when the step of performing the second PAI is performed, the second element is simultaneously implanted into a gate electrode of the second gate structure.

* * * * *